(12) United States Patent
Lee et al.

(10) Patent No.: US 11,782,479 B2
(45) Date of Patent: Oct. 10, 2023

(54) ELECTRONIC APPARATUS AND METHOD OF MANUFACTURING THE SAME

(71) Applicant: Samsung Display Co., LTD., Yongin-si (KR)

(72) Inventors: Sang Keun Lee, Seoul (KR); Hanjong Yoo, Hwaseong-si (KR)

(73) Assignee: Samsung Display Co., LTD., Yongin-si (KR)

( * ) Notice: Subject to any disclaimer, the term of this patent is extended or adjusted under 35 U.S.C. 154(b) by 240 days.

(21) Appl. No.: 17/090,717

(22) Filed: Nov. 5, 2020

(65) Prior Publication Data

US 2021/0255667 A1    Aug. 19, 2021

(30) Foreign Application Priority Data

Feb. 13, 2020  (KR) .................... 10-2020-0017910

(51) Int. Cl.
| | | |
|---|---|---|
| *C23F 1/16* | (2006.01) | |
| *G06F 1/16* | (2006.01) | |
| *H01L 21/673* | (2006.01) | |
| *G02B 1/118* | (2015.01) | |
| *H01L 21/768* | (2006.01) | |
| *H04N 23/57* | (2023.01) | |

(52) U.S. Cl.
CPC ............ *G06F 1/1626* (2013.01); *G02B 1/118* (2013.01); *G06F 1/1605* (2013.01); *H01L 21/67366* (2013.01); *H01L 21/76886* (2013.01); *H04N 23/57* (2023.01)

(58) Field of Classification Search
CPC ...... H05K 3/007; H01L 33/22; H01L 31/2322
See application file for complete search history.

(56) References Cited

U.S. PATENT DOCUMENTS

| | | |
|---|---|---|
| 8,841,836 B2 | 9/2014 | Kim et al. |
| 9,127,371 B2 | 9/2015 | Isurugi et al. |
| 10,242,975 B2 | 3/2019 | Kim |
| 10,362,294 B2 | 7/2019 | Cho et al. |
| 2013/0285539 A1 | 10/2013 | Kim et al. |
| 2014/0264798 A1* | 9/2014 | Otremba ................. H01L 24/83 438/112 |

(Continued)

FOREIGN PATENT DOCUMENTS

| | | |
|---|---|---|
| JP | 4796217 | 10/2011 |
| KR | 10-0754327 | 8/2007 |
| KR | 10-2013-0121454 | 11/2013 |

(Continued)

*Primary Examiner* — Thomas T Pham
(74) *Attorney, Agent, or Firm* — H.C. Park & Associates, PLC

(57) ABSTRACT

A method of manufacturing an electronic apparatus includes the steps of: providing an electronic panel defining a through hole; providing an electronic module having at least a portion thereof received in the through hole; providing a protective member having a first surface adjacent to the electronic panel, a hole area overlapping the through hole, a peripheral area surrounding the hole area, and a second surface facing the first surface and spaced apart from the electronic module, the providing of the protective member including: providing an unfinished protective member; attaching a film to the peripheral area; and forming a generally concave-convex pattern by contacting an acid solution with the hole area.

12 Claims, 10 Drawing Sheets

(56) References Cited

U.S. PATENT DOCUMENTS

2018/0171135 A1* 6/2018 Kasahara ................ C08L 79/00
2019/0115415 A1 4/2019 Choi et al.

FOREIGN PATENT DOCUMENTS

| KR | 10-2015-0087942 | 7/2015 |
| KR | 10-2017-0047094 | 5/2017 |
| KR | 10-2017-0116632 | 10/2017 |
| KR | 10-1913704 | 11/2018 |
| KR | 10-2019-0041553 | 4/2019 |

* cited by examiner

ELECTRONIC APPARATUS AND METHOD OF MANUFACTURING THE SAME

CROSS-REFERENCE TO RELATED APPLICATION

This application claims priority from and the benefit of Korean Patent Application No. 10-2020-0017910, filed on Feb. 13, 2020, which is hereby incorporated by reference for all purposes as if fully set forth herein.

BACKGROUND

Field

Exemplary implementations of the invention relate generally to an electronic apparatus and a method of manufacturing the same, and more particularly, to an electronic apparatus including a camera module and a method of manufacturing the electronic apparatus.

Discussion of the Background

An electronic apparatus includes various electronic components, such as an input sensor that senses an external input and an electronic module. The electronic components are electrically connected to each other by signal lines. The input sensor includes sensing electrodes to sense the external input. The electronic module includes a camera, an infrared sensor, or a proximity sensor. The electronic module is disposed under the input sensor. The input sensor is provided with a hole to expose the electronic module. The above information disclosed in this Background section is only for understanding of the background of the inventive concepts, and, therefore, it may contain information that does not constitute prior art.

SUMMARY

Applicant discovered that in electronic apparatus including a camera module, a reflection phenomenon occurs in the hole for the camera that can interfere with the quality or reliability of the apparatus, such as the resolution of the camera.

Electronic apparatus constructed according to the principles and exemplary implementations of the invention has improved reflectance in the hole area of a window overlapping the electronic module.

Methods of manufacturing electronic apparatus according to the principles and exemplary implementations of the invention improve the reflectance in the hole area of the window overlapping the electronic module. In some exemplary embodiments, the manufacturing method includes forming a concave-convex pattern in the hole area of the window overlapping the electronic module to improve reflectance.

Additional features of the inventive concepts will be set forth in the description which follows, and in part will be apparent from the description, or may be learned by practice of the inventive concepts.

According to one aspect of the invention, a method of manufacturing an electronic apparatus includes the steps of: providing an electronic panel defining a through hole; providing an electronic module having at least a portion thereof received in the through hole; providing a protective member having a first surface adjacent to the electronic panel, a hole area overlapping the through hole, a peripheral area surrounding the hole area, and a second surface facing the first surface and spaced apart from the electronic module, the providing of the protective member including: providing an unfinished protective member; attaching a film to the peripheral area; and forming a concave-convex pattern by contacting an acid solution with the hole area.

The film may be an acid-resistant film.

The film may include an opening overlapping the through hole.

The step of forming of the concave-convex pattern may include immersing the unfinished protective member into the acid solution.

The concave-convex pattern may include a plurality of concave portions recessed toward the second surface, with at least some of the concave portions having a truncated cone shape or a hemispherical shape.

The concave-convex pattern may include a plurality of concave portions with random sizes.

The protective member may have a thickness ($D_1$) and the concave-convex pattern has a height ($H_1$) that satisfy the following Equation: $0.71 \times 10^{-5} \leq H_1/D_1 \leq 3 \times 10^{-5}$.

The concave-convex pattern may have a height equal to or greater than about 5 nm and equal to or smaller than about 15 nm in a thickness direction of the protective member.

The protective member may have a thickness equal to or greater than about 0.5 mm and equal to or smaller than about 0.7 mm.

After the forming of the concave-convex pattern, the steps may further include cleaning the unfinished protective member; and removing the film.

The hole area may have an average surface roughness greater than an average surface roughness of the peripheral area.

The hole area may have an average surface roughness greater than an average surface roughness of the second surface.

The electronic module may include a camera module and the protective member may include a window.

According to another aspect of the invention, an electronic apparatus includes: an electronic panel having a through hole; an electronic module having at least a portion thereof received in the through hole; and a protective member having a first surface adjacent to the electronic panel, a hole area overlapping the through hole, a peripheral area surrounding the hole area and a second surface facing the first surface and spaced apart from the electronic module, wherein the hole area includes a concave-convex pattern.

The concave-convex pattern may include a plurality of concave portions recessed toward the second surface, with at least some of the concave portions having a truncated cone shape or a hemispherical shape.

The concave-convex pattern may have a height equal to or greater than about 5 nm and equal to or smaller than about 15 nm in a thickness direction of the protective member.

The protective member may have a thickness ($D_1$) and the concave-convex portion may have a height ($H_1$) that satisfy the following Equation: $0.71 \times 10^{-5} \leq H_1/D_1 \leq 3 \times 10^{-5}$.

The hole area may have an average surface roughness greater than an average surface roughness of the peripheral area.

The electronic module may include a camera module and the protective member may include a window.

An adhesive layer may be disposed between the window and the electronic panel with the adhesive layer defining an opening therethrough that may overlap the through hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
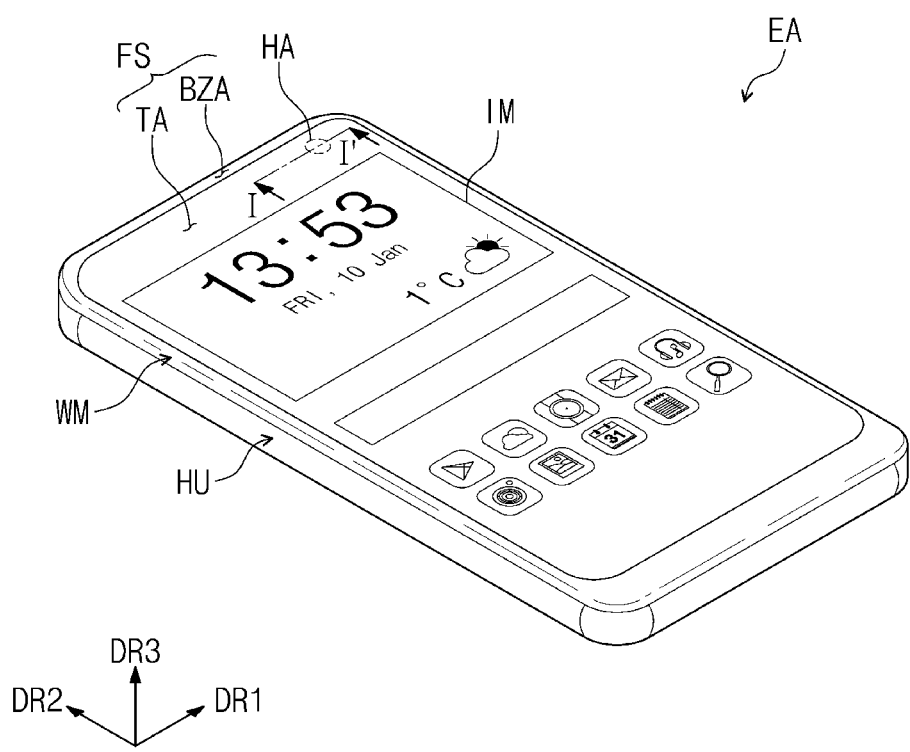
FIG. 1 is a perspective view of an exemplary embodiment illustrating an electronic apparatus constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, components, regions, layers and/or sections, these elements components, regions, layers and/or sections should not be limited by these terms. These terms are used to distinguish one element, component, region, layer and/or section from another element, component, region, layer and/or section. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
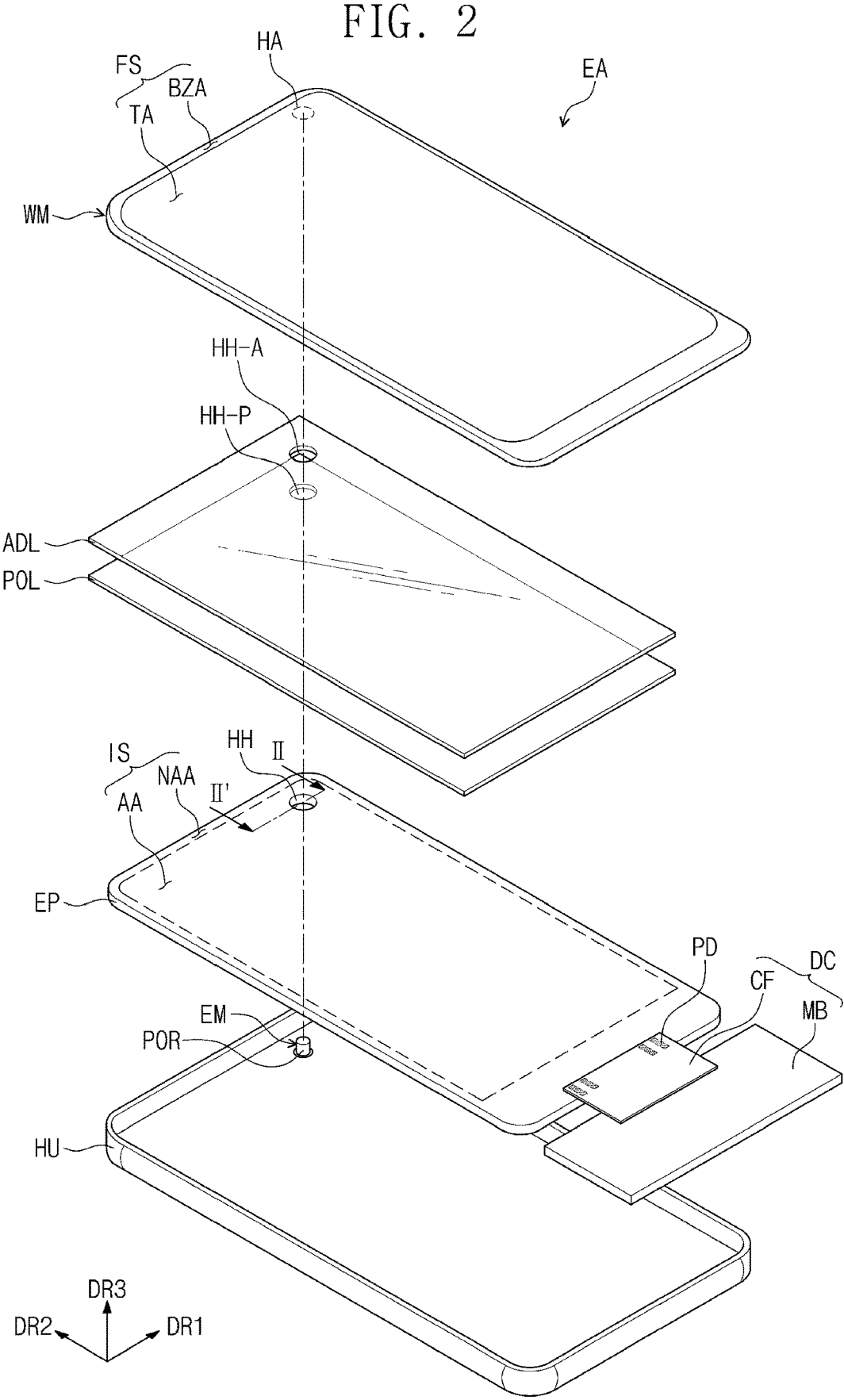
FIG. 2 is an exploded perspective view of the electronic apparatus of FIG. 1.
Figure 3:
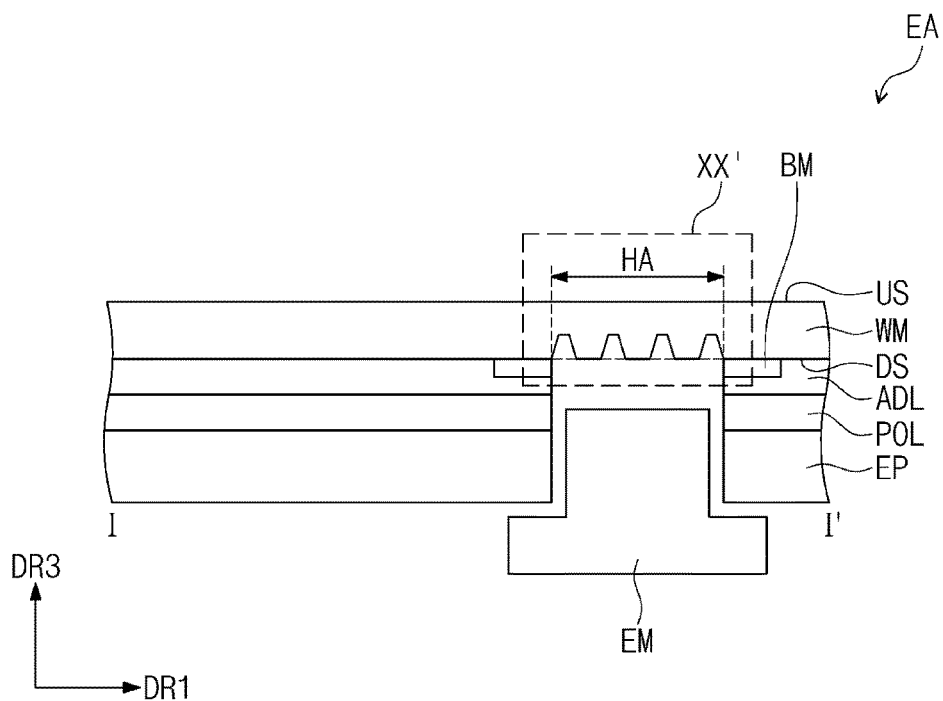
FIG. 3 is a cross-sectional view taken along a line I-I' of FIG. 1.
Figure 4:
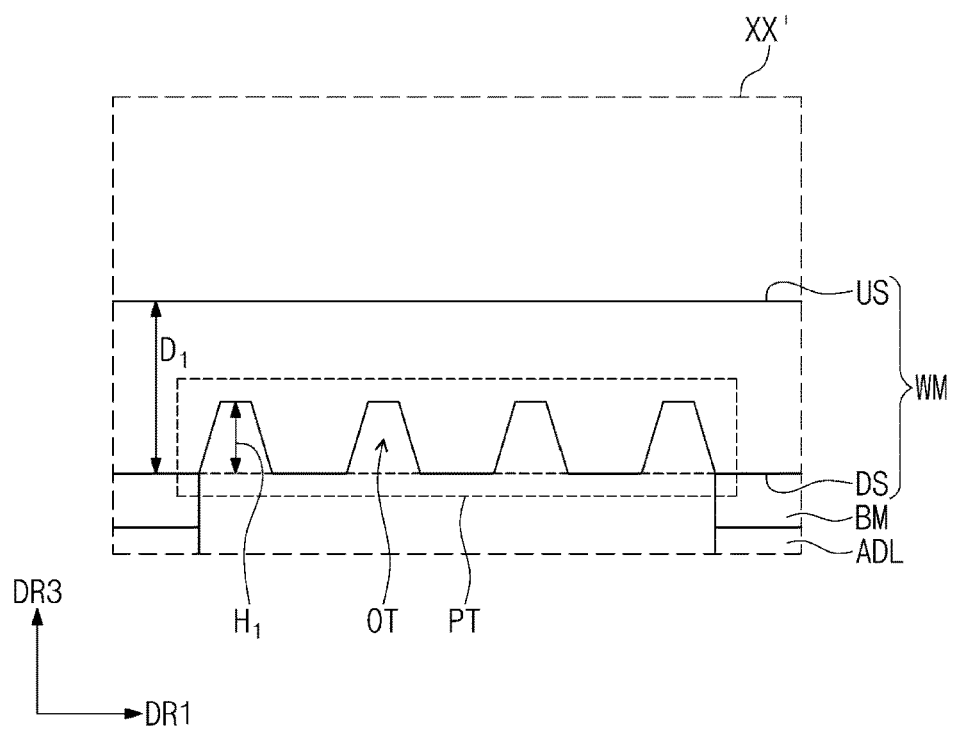
FIG. 4 is a cross-sectional view illustrating an enlarged view of area XX' of FIG. 3.

FIG. 1 is a perspective view of an exemplary embodiment illustrating an electronic apparatus constructed according to principles of the invention. FIG. 2 is an exploded perspective view of the electronic apparatus of FIG. 1. FIG. 3 is a cross-sectional view taken along a line I-I' of FIG. 1. FIG. 4 is a cross-sectional view illustrating an enlarged view of area XX' of FIG. 3.

The electronic apparatus EA may be an apparatus activated in response to an electrical signal. The electronic apparatus EA may take the form of various exemplary embodiments. For example, the electronic apparatus EA may be applied to a tablet computer, a notebook computer, a computer, or a smart television. However, these are merely exemplary, and the electronic apparatus EA may be applied to other electronic items as long as they do not depart from the inventive concepts. FIG. 1 shows a smartphone as a representative example of the electronic apparatus EA.

FIG. 1 and the following figures show first, second, and third directional axes DR1, DR2, and DR3. As used herein, directions indicated by the first, second, and third directional axes DR1, DR2, and DR3 are relative to each other, and thus, the directions indicated by the first, second, and third directional axes DR1, DR2, and DR3 may be changed to other directions.

The direction indicated by the third directional axis DR3 may be defined as a direction in which an image is provided to a user. In addition, the first directional axis DR1 and the second directional axis DR2 may be perpendicular to each other, and the third directional axis DR3 may be a normal line direction with respect to a plane defined by the first directional axis DR1 and the second directional axis DR2.

The electronic apparatus EA may display an image IM through a transmission area TA. The image IM may include at least one of a still image and a motion image. FIG. 1 depicts a clock widget and application icons as a representative example of the image IM.

In some exemplary embodiments, front (or upper) and rear (or lower) surfaces of each member may be defined with respect to a direction in which the image IM is displayed. The front and rear surfaces may be opposite to each other in the third directional axis DR3.

The transmission area TA may have a generally quadrangular shape, however, it should not be limited thereto or thereby. The transmission area TA may have various shapes, and it should not be particularly limited.

A bezel area BZA may be defined adjacent to the transmission area TA. The bezel area BZA may surround the transmission area TA. However, this is merely exemplary, and the bezel area BZA may be disposed adjacent to only one side of the transmission area TA or may be omitted. The electronic apparatus EA according to some exemplary embodiments may be implemented in various ways, and it should not be particularly limited.

The electronic apparatus EA may have an appearance defined by a window WM and an external case HU. A front surface FS of the electronic apparatus EA may be defined by the window WM.

In the electronic apparatus EA of the exemplary embodiment, the window WM may include the transmission area TA and the bezel area BZA. A front surface FS of the window WM including the transmission area TA and the bezel area BZA may correspond to the front surface FS of the electronic apparatus EA. The user may view the image provided through the transmission area TA corresponding to the front surface FS of the electronic apparatus EA.

The electronic apparatus EA may include an electronic panel EP through which a through hole HH is defined. At least a portion of an electronic module EM may be received in the through hole HH. The window WM disposed on the electronic panel EP is provided with a hole area HA defined therein to overlap the through hole HH. The window WM may include a generally concave-convex portion that may be in the form of a generally concave-convex pattern PT provided in the hole area HA, as shown in FIG. 4 and described in more detail herein. The electronic apparatus EA may be manufactured by a manufacturing method of the exemplary embodiment described below, and the generally concave-convex pattern PT may be formed in the electronic apparatus EA by the manufacturing method of the exemplary embodiments.

Referring to FIG. 2, the electronic apparatus EA may include a protective member that may be in the form of the window WM, the electronic panel EP, an optical film POL, an adhesive layer ADL, a circuit board DC, the electronic module EM, and the external case HU.

The electronic panel EP may display the image IM. The electronic panel DP may include a front surface IS including a display area AA and a non-display area NAA. The display area AA may be an area through which the image IM is displayed. The transmission area TA may overlap an entire surface or at least a portion of the display area AA. The non-display area NAA may be covered by the bezel area BZA. The non-display area NAA may be disposed adjacent to the display area AA and may surround the display area AA. The non-display area NAA may be covered by the bezel area BZA and may not be viewed from the outside. The non-display area NAA may be omitted.

The circuit board DC may be connected to the electronic panel EP. The circuit board DC may include a flexible board CF and a main board MB. The flexible board CF may include an insulating film and conductive lines mounted on the insulating film. The conductive lines may be connected to pads PD to electrically connect the circuit board DC to the electronic panel EP. The main board MB may include signal lines and electronic elements. The electronic elements may be connected to the signal lines and may be electrically connected to the electronic panel EP.

The electronic panel EP according to the illustrated exemplary embodiment may be provided with the through hole HH defined therethrough. At least a portion of the through hole HH may be surrounded by the display area AA. The through hole HH may be spaced apart from the non-display area NAA.

At least a portion POR of the electronic module EM may be inserted into and received in the through hole HH. The electronic module EM may receive an external input applied thereto through the through hole HH or may provide an output through the through hole HH. The electronic module EM may include a variety of functional modules to operate the electronic apparatus EA, such as a camera module. The electronic module EM may further include a control module, a wireless communication module, an image input module, an audio input module, an audio output module, a light emitting module, or the like.

The optical film POL may be disposed between the window WM and the electronic panel EP. The optical film POL may include a polarizing film or a color filter. However, the exemplary embodiments should not be limited thereto or thereby, and the optical film POL may be omitted.

The optical film POL may be provided with an opening HH-P defined therethrough. The opening HH-P of the optical film POL may have a shape matching that of the through hole HH of the electronic panel EP, however, this is merely exemplary. Process errors may exist during manufacture in position and size of the opening HH-P of the optical film POL and the through hole HH of the electronic panel EP, so their shapes may not correspond exactly.

According to an exemplary embodiment, the adhesive layer ADL may be disposed between the optical film POL and the window WM. The adhesive layer ADL may connect the optical film POL and the window WM. For example, in a case where the optical film POL is a color filter formed on the electronic panel EP, the adhesive layer ADL may substantially connect the electronic panel EP and the window WM. The adhesive layer ADL may include an optically clear adhesive, an optically clear resin, or a pressure sensitive adhesive. However, the exemplary embodiments should not be limited thereto or thereby, and a variety of materials may be used as the adhesive layer ADL as long as they are optically transparent.

The adhesive layer ADL may be provided with an opening HH-A defined therethrough. The opening HH-A of the adhesive layer ADL may be formed to correspond to the through hole HH of the electronic panel EP. FIG. 2 shows the opening HH-A of the adhesive layer ADL and the opening HH-P of the optical film POL, which are disposed to be generally aligned with the through hole HH of the electronic panel EP. However, this is merely exemplary, and the opening HH-A of the adhesive layer ADL and the opening HH-P of the optical film POL may not be perfectly aligned with the through hole HH of the electronic panel EP due to the process errors.

The window WM may include the front surface FS exposed to the outside. The front surface FS of the electronic apparatus EA may be defined substantially by the front surface FS of the window WM.

The bezel area BZA may have a relatively lower transmittance than that of the transmission area TA. The bezel area BZA may cover the non-display area NAA of the electronic panel EP and may prevent the non-display area NAA from being viewed from the outside. However, this is merely exemplary, and the bezel area BZA may be omitted.

The transmission area TA may be optically transparent. The transmission area TA may have a shape corresponding to that of the display area AA. For example, the transmission area TA may overlap an entire surface or at least a portion of the display area AA. The image IM displayed through the display area AA of the electronic panel EP may be viewed from the outside through the transmission area TA.

Referring to FIG. 3, the adhesive layer ADL may further include a light blocking portion BM. The light blocking portion BM may be disposed in some areas of the adhesive layer ADL overlapping the electronic module EM and may include a light blocking material. In addition, the light blocking portion BM may surround the electronic module EM. For example, the light blocking portion BM may include a black dye, a black pigment, or a metal or metal oxide such as a carbon black or chromium.

According to an exemplary embodiment, the window WM may include a first surface DS that includes the hole area HA and a peripheral area SA surrounding the hole area HA and a second surface US opposite to the first surface DS and spaced apart from the electronic panel EP.

The window WM may include the generally concave-convex pattern PT in the hole area HA. As described above, the hole area HA of the window WM may overlap the through hole HH of the electronic panel EP. The portion of the electronic module EM may be inserted into the through hole HH of the electronic panel EP. The hole area HA of the window WM may overlap the portion of the electronic module EM, which is inserted into the through hole HH. That is, the generally concave-convex pattern PT of the hole area HA may overlap the portion of the electronic module EM.

The generally concave-convex pattern PT may be formed in the hole area HA of the first surface DS of the window WM, and the first surface DS of the window WM may be adjacent to the electronic module EM. The first surface DS may be a lower surface of the window WM, and the second surface US opposite to the first surface DS and spaced apart from the electronic panel EP may be an upper surface of the window WM.

FIG. 3 shows a camera module as a representative example of the electronic module EM. The generally concave-convex pattern PT formed in the hole area HA may lower a reflectance of the window WM. When a light passes through different media, reflection phenomenon may occur due to the difference in refractive index. When a light travels inside or outside the electronic apparatus, the reflection phenomenon may occur in the window WM adjacent to the camera module due to the difference in refractive index. According to the illustrated exemplary embodiment, as the window WM includes the generally concave-convex pattern PT formed in the hole area HA overlapping the camera module, the reflection phenomenon of the light may be reduced in the window WM, and the resolution of the camera module that photographs an external object through the hole area HA may be improved.

Figure 5:
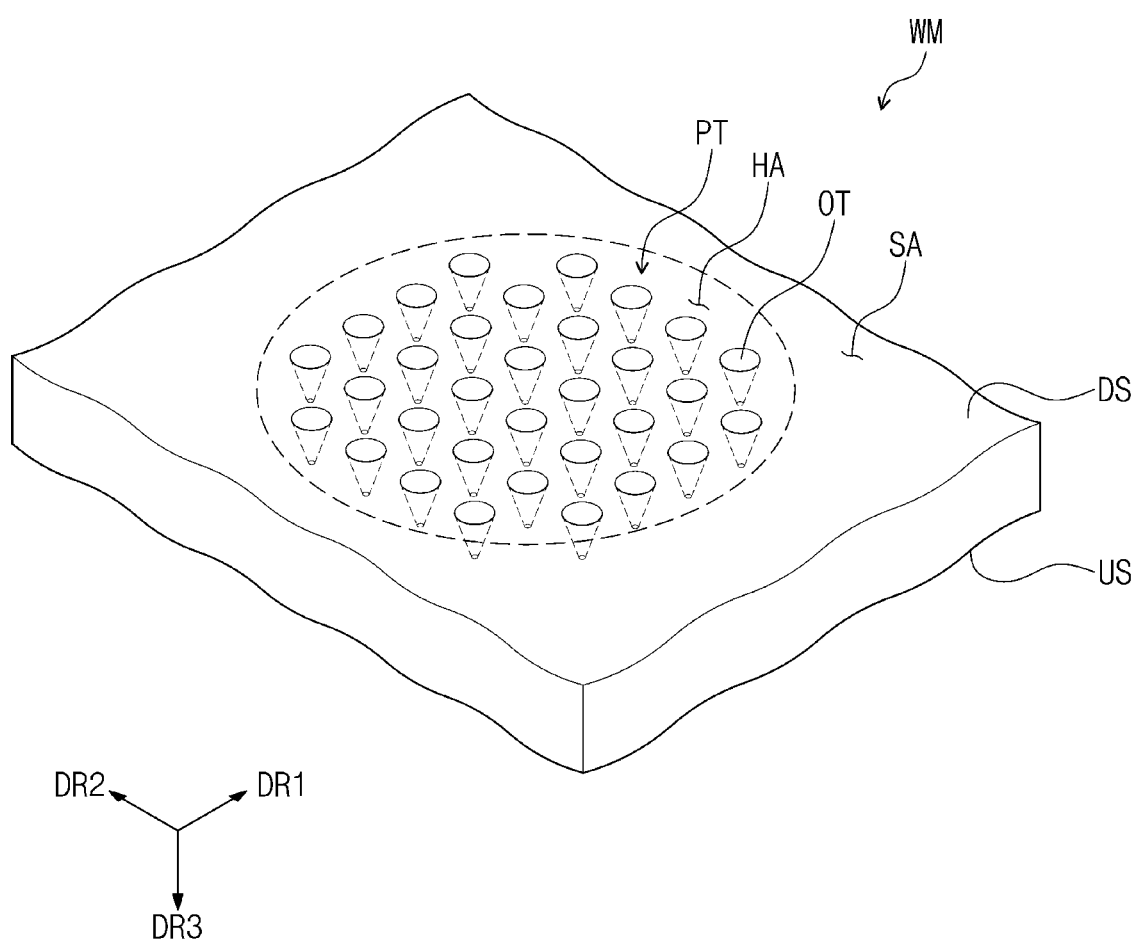
FIG. 5 is a perspective view of an exemplary embodiment illustrating a portion of an electronic apparatus of FIG. 4.
Figure 6:
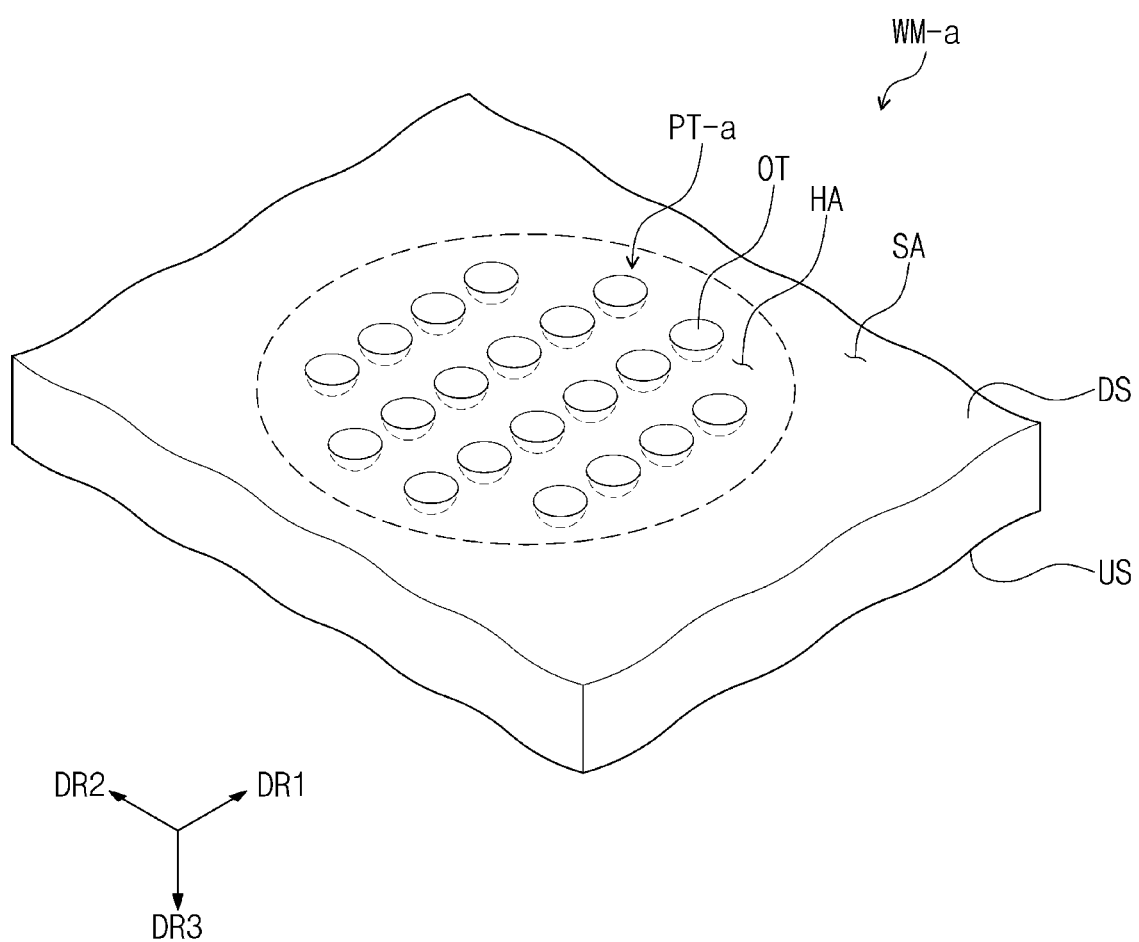
FIG. 6 is a perspective view of another exemplary embodiment illustrating a portion of an electronic apparatus of FIG. 4.

FIG. 4 is an enlarged view showing the area XX' of FIG. 3 in which the generally concave-convex pattern PT is disposed. FIGS. 5 and 6 are perspective views showing generally concave-convex patterns PT and PT-a according to some exemplary embodiments.

FIG. 4 shows the thickness $D_1$ of the window WM and a height $H_1$ of the generally concave-convex pattern PT in the third directional axis DR3. The generally concave-convex pattern PT shown in FIG. 4 may have a shape corresponding to a shape of a generally concave-convex pattern PT shown in FIG. 5. According to an exemplary embodiment, the thickness $D_1$ of the window WM and the height $H_1$ of the generally concave-convex pattern PT may satisfy Equation 1. The height $H_1$ of the generally concave-convex pattern PT may be the depth of concave portions OT recessed, which will be described below. The height $H_1$ of the concave portions OT may correspond to the height $H_1$ of the generally concave-convex pattern PT.

$$0.71 \times 10^{-5} \leq H_1/D_1 \leq 3 \times 10^{-5} \qquad \text{Equation 1:}$$

The height $H_1$ of the generally concave-convex pattern PT with respect to the thickness $D_1$ of the window WM may be about $0.71 \times 10^{-5}$ or more and about $3 \times 10^{-5}$ or less. The thickness $D_1$ of the window WM may be equal to or greater than about 0.5 mm and equal to or smaller than about 0.7 mm. The height $H_1$ of the generally concave-convex pattern PT may be equal to or greater than about 5 nm or equal to or smaller than about 15 nm. For example, the thickness $D_1$ of the window WM may be about 0.5 mm, and the height $H_1$ of the generally concave-convex pattern PT may be about 5 nm. That is, the height $H_1$ of the generally concave-convex pattern PT is about one-hundred thousandth of the thickness $D_1$ of the window WM, and the electronic apparatus EA may be normally operated when the electronic apparatus EA is manufactured by assembling the electronic module EM, the electronic panel EP, and the window WM.

The generally concave-convex pattern PT may include the generally concave portions OT recessed to the second surface US. That is, the generally concave portions OT may be formed by recessing an unfinished window WM-P (refer to FIG. 12) toward the second surface US in an operation (S330, refer to FIG. 9) of forming the generally concave-convex pattern PT described below.

FIG. 5 is a perspective view of an exemplary embodiment illustrating a portion of an electronic apparatus of FIG. 4. FIG. 6 is a perspective view of another exemplary embodiment illustrating a portion of an electronic apparatus of FIG. 4.

FIG. 5 shows the generally concave portions OT each having a generally truncated cone shape, and FIG. 6 shows the generally concave portions OT each having a generally hemispherical shape. However, the exemplary embodiments should not be limited thereto or thereby, and the generally concave-convex pattern PT may have a variety of shapes. In addition, the hole area HA in which the generally concave-convex pattern PT is formed has a generally circular shape when viewed in a plane, however, the hole area HA should not be limited thereto or thereby. The hole area HA may have a variety of shapes, such as a generally oval shape, a generally polygonal shape, or the like.

Referring to FIG. 5, the generally concave portions OT may have the generally truncated cone shape that is viewed as a generally circular shape in a plane defined by the first directional axis DR1 and the second directional axis DR2, extends along a direction indicated by the third directional axis DR3, with its diameter decreasing along the third directional axis DR3. Different from the above, each of the generally concave portions OT shown in FIG. 6 may have the generally hemispherical shape, and a generally rounded face of each of the generally hemispherical shape may face the third directional axis DR3.

The first surface DS of the window WM according to the illustrated exemplary embodiment may include the hole area HA and the peripheral area SA surrounding the hole area HA. The generally concave-convex pattern PT may not be formed in the peripheral area SA. In the first surface DS of the window WM, the hole area HA in which the generally concave-convex pattern PT is formed may have an average surface roughness different from an average surface roughness of the peripheral area SA in which the generally concave-convex pattern PT is not formed. The average surface roughness of the hole area HA may be greater than the average surface roughness of the peripheral area SA. The average surface roughness of the hole area HA may increase due to the generally concave-convex pattern PT.

The window WM may include the first surface DS adjacent to the electronic module EM and the second surface US spaced apart from the first surface DS in the third directional axis DR3. The second surface US of the window WM may correspond to the above-described front surface FS (refer to FIG. 2). That is, the second surface US of the window WM may be exposed to the direction in which the image IM is displayed.

Unlike the first surface DS, the generally concave-convex pattern PT may not be formed on the second surface US, and the average surface roughness of the second surface US may be different from the average surface roughness of the first surface DS. The average surface roughness of the second surface US may be smaller than the average surface roughness of the first surface DS. Because the generally concave-convex pattern PT is formed in the hole area HA of the first surface DS, the average surface roughness of the first surface DS may be greater than the average surface roughness of the second surface US. The average surface roughness of the second surface US may be substantially the same as the average surface roughness of the peripheral area SA of the first surface DS. However, the exemplary embodiments should not be limited thereto or thereby, and the average surface roughness of the second surface US may be different from the average surface roughness of the peripheral area SA of the first surface DS.

Figure 7:
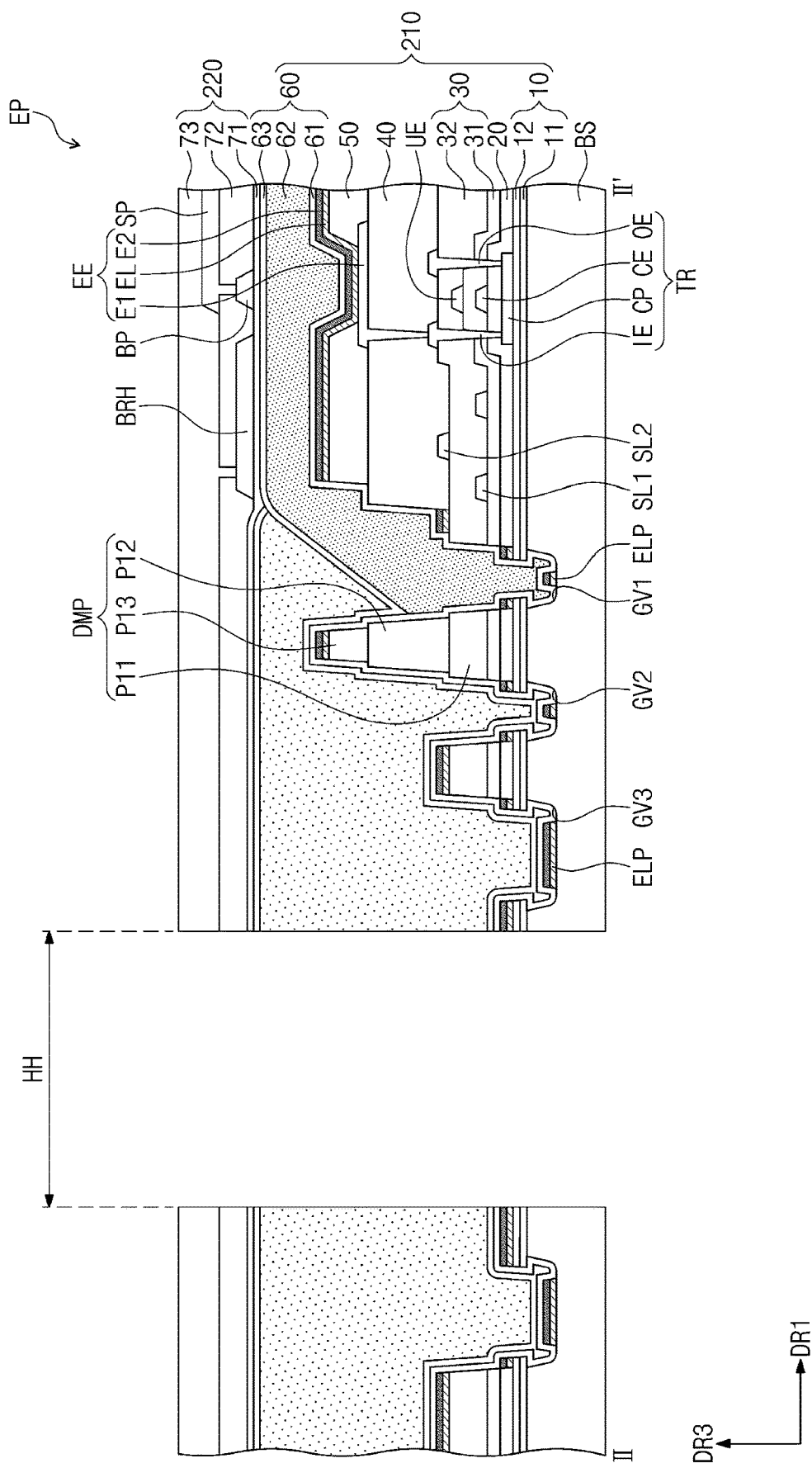
FIG. 7 is a cross-sectional view of an exemplary embodiment illustrating a portion of an electronic apparatus taken along a line II-IF of FIG. 2.

FIG. 7 is a cross-sectional view of an exemplary embodiment illustrating a portion of an electronic apparatus taken along a line II-IF of FIG. 2. As described above, the electronic panel EP may be provided with the through hole HH defined therethrough and may include a display unit 210 and a sensing unit 220.

The display unit 210 and the sensing unit 220 may be stacked along the third directional axis DR3. The display unit 210 may include a base substrate BS, a plurality of insulating layers 10, 20, 30, 40, and 50, and an encapsulation layer 60. The base substrate BS may be an insulating substrate. For example, the base substrate BS may include a plastic substrate or a glass substrate.

A thin film transistor TR and an emission element EE are shown as a representative example. The insulating layers 10, 20, 30, 40, and 50 may include first, second, third, fourth, and fifth insulating layers 10, 20, 30, 40, and 50 sequentially stacked one on another. Each of the first, second, third, fourth, and fifth insulating layers 10, 20, 30, 40, and 50 may include an organic material and/or an inorganic material and may have a single-layer or multi-layer structure.

The first insulating layer 10 may be disposed on the base substrate BS to cover an entire surface of the base substrate BS. The first insulating layer 10 may include a barrier layer 11 and/or a buffer layer 12. At least one of the barrier layer 11 and the buffer layer 12 may be omitted or may have a multi-layer structure, however, it should not be particularly limited. The thin film transistor TR may be disposed on the first insulating layer 10. The thin film transistor TR may include a semiconductor pattern CP, a control electrode CE, an input electrode IE, and an output electrode OE. The semiconductor pattern CP may be disposed on the first insulating layer 10. The semiconductor pattern CP may include a semiconductor material. The control electrode CE may be spaced apart from the semiconductor pattern CP with the second insulating layer 20 interposed therebetween.

The input electrode IE and the output electrode OE may be disposed on the third insulating layer 30 and may be spaced apart from each other when viewed in a plan view. The input electrode IE and the output electrode OE may be respectively connected to one side and the other side of the semiconductor pattern CP after penetrating through the second insulating layer 20 and the third insulating layer 30. The display unit 210 may further include an upper electrode UE.

The third insulating layer 30 may include a lower layer 31 and an upper layer 32, however, this is merely exemplary. The third insulating layer 30 may have a single-layer structure according to another exemplary embodiment. The upper electrode UE may be disposed between the lower layer 31 and the upper layer 32, and the upper electrode UE may overlap the control electrode CE when viewed in a plane.

The fourth insulating layer 40 may be disposed on the third insulating layer 30 and may cover the input electrode IE and the output electrode OE. The emission element EE may be disposed on the fourth insulating layer 40. The emission element EE may include a first electrode E1, a functional layer EL, and a second electrode E2.

The first electrode E1 may be connected to the thin film transistor TR after penetrating through the fourth insulating layer 40. The electronic panel EP may further include a separate connection electrode disposed between the first electrode E1 and the thin film transistor TR. In this case, the first electrode E1 may be electrically connected to the thin film transistor TR by the connection electrode.

The fifth insulating layer 50 may be disposed on the fourth insulating layer 40. The fifth insulating layer 50 may include an organic material and/or an inorganic material and may have a single-layer or multi-layer structure. The fifth insulating layer 50 may be a pixel definition layer.

The functional layer EL may be disposed between the first electrode E1 and the second electrode E2. The functional layer EL may include at least one emission layer. For example, the functional layer EL may include at least one material among materials respectively emitting red, green, and blue colors and may include a fluorescent material or a phosphorescent material.

The functional layer EL may further include an electric charge control layer in addition to the emission layer. The functional layer EL may include at least one of a hole transport material, a hole injection material, an electron transport material, and an electron injection material.

The second electrode E2 may be disposed on the functional layer EL. The second electrode E2 may face the first electrode E1. The second electrode E2 may include a transmissive conductive material or a semi-transmissive conductive material. However, this is merely exemplary, and the emission element EE according to some exemplary embodiments may be driven in a rear surface light emitting type in which the first electrode E1 includes the transmissive conductive material or the semi-transmissive conductive material or may be driven in a both-surface light emitting type in which the emission element EE emits the light to the front and rear surfaces depending on its design, however, it should not be particularly limited.

The encapsulation layer 60 may be disposed on the emission element EE and may encapsulate the emission element EE. A capping layer may be further disposed between the second electrode E2 and the encapsulation layer 60 to cover the second electrode E2.

The encapsulation layer 60 may include a first inorganic layer 61, an organic layer 62, and a second inorganic layer 63, which are sequentially stacked in the third directional axis DR3, however, it should not be limited thereto or thereby. The encapsulation layer 60 may include a plurality of inorganic layers and a plurality of organic layers.

The first inorganic layer 61 may cover the second electrode E2. The first inorganic layer 61 may prevent external moisture or oxygen from entering the emission element EE.

The organic layer 62 may be disposed on the first inorganic layer 61 and may be in contact with the first inorganic layer 61. The organic layer 62 may provide a flat surface on the first inorganic layer 61.

The second inorganic layer 63 may be disposed on the organic layer 62 and may cover the organic layer 62. The second inorganic layer 63 may encapsulate moisture discharged from the organic layer 62 and may prevent the moisture from being discharged to the outside of the organic layer 62.

Grooves GV1, GV2, and GV3 may be defined to be spaced apart from each other. The grooves GV1, GV2, and GV3 may include first, second, and third grooves GV1, GV2, and GV3. Each of the grooves GV1, GV2, and GV3 may be recessed from an upper surface of the base substrate BS. Deposition patterns ELP may be disposed in the grooves GV1, GV2, and GV3, respectively, and may be covered by at least one of the first inorganic layer 61 and the second inorganic layer 63.

A dam portion DMP may be provided in plural, and the dam portions DMP may be disposed between the grooves GV1, GV2, and GV3. The dam portion DMP may have a stacked structure of first, second, and third layers P11, P12, and P13. However, this is merely exemplary, and the dam portion DMP may have a single-layer structure, but it should not be particularly limited.

Pixels may be disposed around the through hole HH and may surround the through hole HH when viewed in a plane. The signal lines SL1 and SL2 may be connected to the pixels. A first signal line SL1 may correspond to a scan line. A second signal line SL2 may correspond to a data line.

The sensing unit 220 may include a plurality of conductive patterns and a plurality of sensing insulating layers 71, 72, and 73. The sensing insulating layers 71, 72, and 73 may include first, second, and third sensing insulating layers 71, 72, and 73 sequentially stacked in the third directional axis DR3 as a representative example.

Each of the first, second, and third sensing insulating layers 71, 72, and 73 may include an inorganic layer and/or an organic layer. In some exemplary embodiments, each of the first, second, and third sensing insulating layers 71, 72, and 73 may have a single-layer structure. According to another exemplary embodiment, each of the first, second, and third sensing insulating layers 71, 72, and 73 may have a stacked structure of plural layers being in contact with each other, however, it should not be limited thereto or thereby.

A connection pattern BP and a sensing pattern SP may be a conductive pattern. The connection pattern BP and the sensing pattern SP may be disposed on different layers from each other. A connection line BRH may be disposed between the first sensing insulating layer 71 and the second sensing insulating layer 72.

Figure 8:
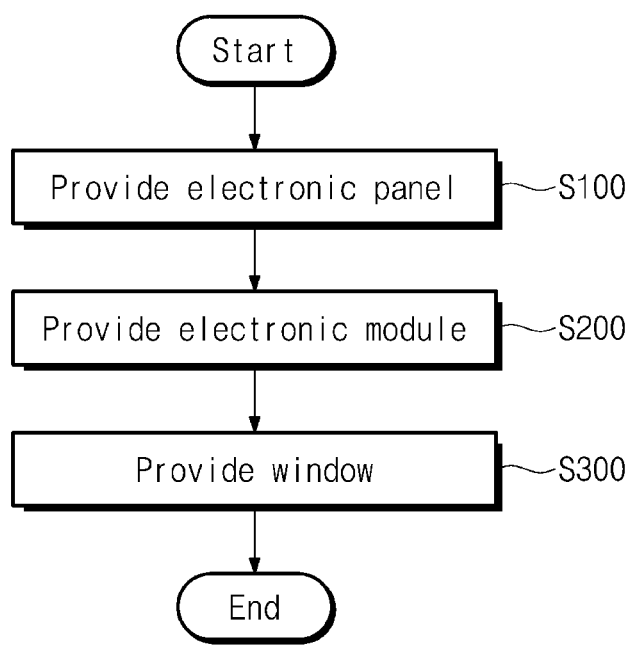
FIG. 8 is a flowchart illustrating an exemplary embodiment of a method of manufacturing an electronic apparatus according to principles of the invention.
Figure 9:
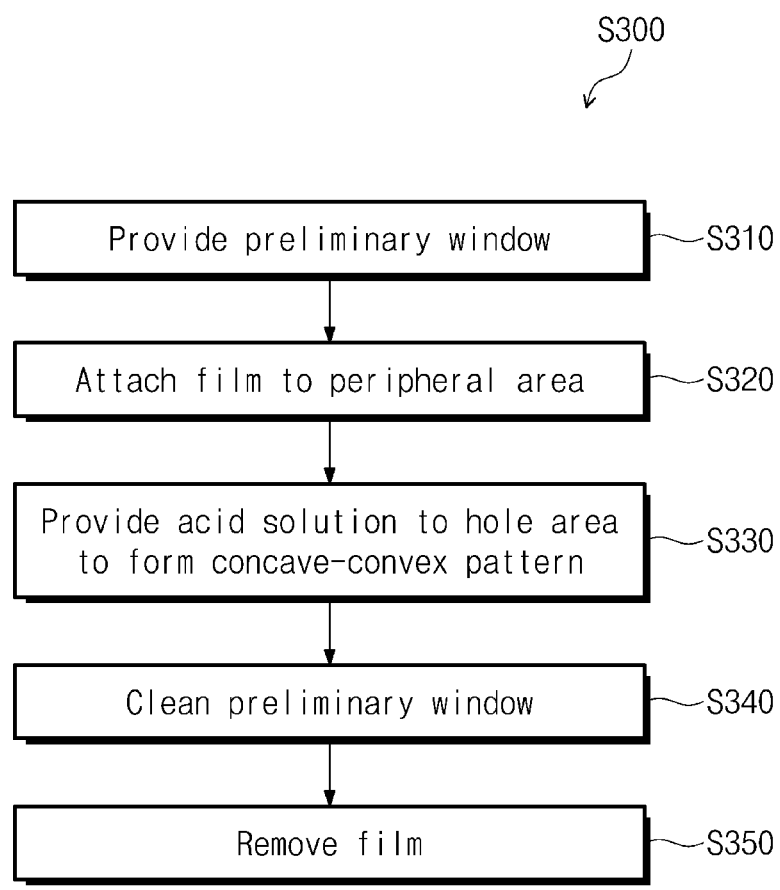
FIG. 9 is a flowchart illustrating an exemplary embodiment of a portion of a manufacturing method of an electronic apparatus according to principles of the invention.
Figure 10:
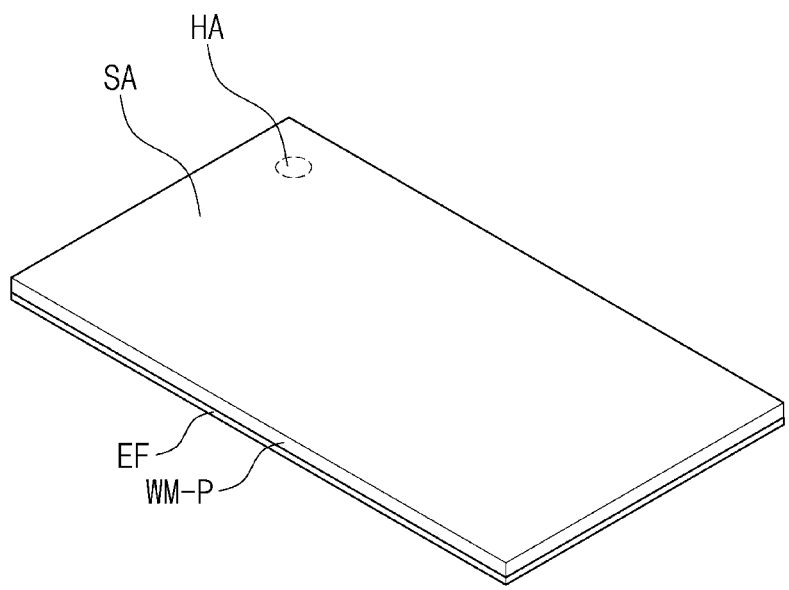
FIG. 10 is a perspective view illustrating an exemplary embodiment of a portion of a manufacturing method of an electronic apparatus according to principles of the invention.
Figure 11:
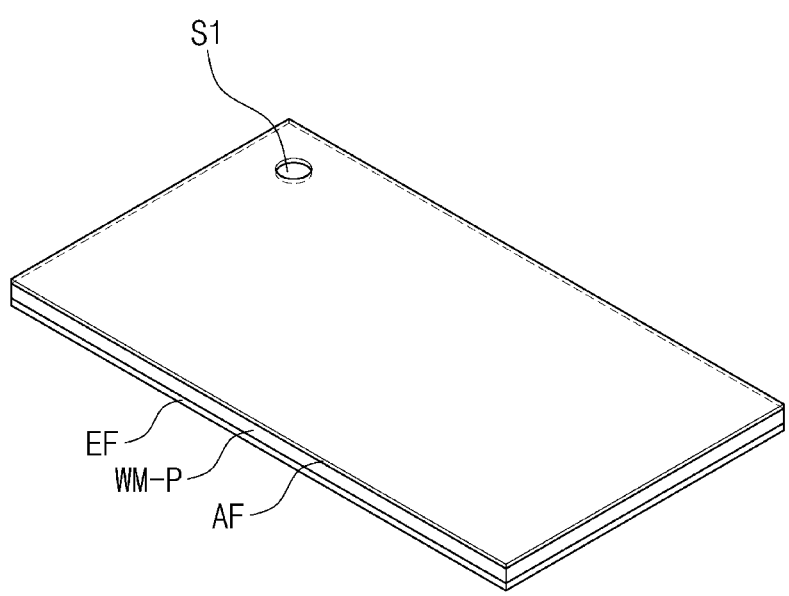
FIG. 11 is a perspective view illustrating an exemplary embodiment of a portion of a manufacturing method of an electronic apparatus according to principles of the invention.
Figure 12:
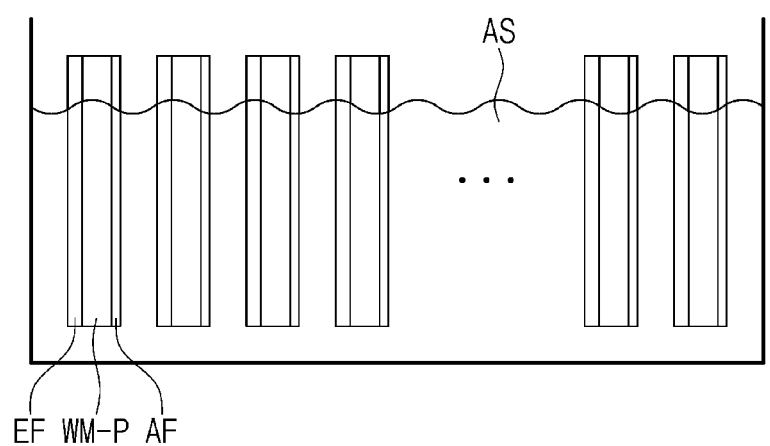
FIG. 12 is a cross-sectional view illustrating an exemplary embodiment of a portion of a manufacturing method of an electronic apparatus according to principles of the invention.

FIG. 8 is a flowchart illustrating an exemplary embodiment of a method of manufacturing an electronic apparatus according to principles of the invention. FIG. 9 is a flowchart illustrating an exemplary embodiment of a portion of a manufacturing method of an electronic apparatus according to principles of the invention. FIG. 10 is a perspective view illustrating an exemplary embodiment of a portion of a manufacturing method of an electronic apparatus according to principles of the invention. FIG. 11 is a perspective view illustrating an exemplary embodiment of a portion of a manufacturing method of an electronic apparatus according to principles of the invention. FIG. 12 is a cross-sectional view illustrating an exemplary embodiment of a portion of a manufacturing method of an electronic apparatus according to principles of the invention.

In the exemplary manufacturing method of the electronic apparatus described below, repetitive descriptions of the above-described electronic apparatus EA will be omitted to avoid redundancy, and different features from the above-described electronic apparatus EA will be mainly described.

The manufacturing method of the electronic apparatus EA may include providing the electronic panel EP (S100), providing the electronic module EM (S200), and providing the window WM (S300).

The providing of the electronic panel EP (S100) may provide the electronic panel EP through which the through hole HH is defined. The providing of the electronic module EM (S200) may provide the electronic module EM of which at least a portion is inserted into the through hole HH.

The providing of the window WM (S300) may provide the window WM including the first surface DS disposed adjacent to the electronic panel EP and provided with the hole area HA overlapping the through hole HH and the peripheral area SA surrounding the hole area HA and the second surface US facing the first surface DS and spaced apart from the electronic module EM.

The providing of the window WM (S300) may include providing the unfinished window WM-P (S310), attaching a film AF to the peripheral area SA of the unfinished window WM-P (S320), and providing an acid solution AS to the hole area HA to which the film AF is not attached to form the generally concave-convex pattern PT (S330).

FIGS. 10 to 12 schematically show the providing of the window WM (S300). FIG. 10 shows the providing of the unfinished window WM-P (S310). FIG. 11 shows the attaching of the film AF to the peripheral area SA of the unfinished window WM-P (S320). FIG. 12 shows the providing of the acid solution AS to the hole area HA to which the film AF is not attached to form the generally concave-convex pattern PT (S330). The manufacturing method of the electronic apparatus EA may further include cleaning the unfinished window (S340) and removing the film AF (S350) after the providing of the acid solution AS to form the generally concave-convex pattern PT (S330).

Referring to FIG. 10, a protective film EF may be attached to a lower side of the unfinished window WM-P. The window WM may be formed by processing the unfinished window WM-P, and, as described above, the generally concave-convex pattern PT may be formed only in the first surface DS of the window WM. The protective film EF may be attached to the second surface US of the window WM such that the generally concave-convex pattern PT is not formed on the second surface US of the window WM. However, the exemplary embodiments should not be limited thereto or thereby, and other materials may be used to protect the second surface US of the unfinished window WM-P.

According to some exemplary embodiments, the film AF may be attached to the first surface DS of the unfinished window WM-P. The film AF may be provided with a film opening Si defined therethrough to overlap the hole area HA of the unfinished window WM-P. That is, the film AF may be attached to only the peripheral area SA except for the hole area HA of the unfinished window WM-P.

According to some exemplary embodiments, the film AF may be an acid-resistant film. The acid-resistant film may be provided to prevent the acid solution from being in contact with the peripheral area SA of the unfinished window WM-P, and the film AF should not be particularly limited as long as the film AF is capable of preventing the acid solution from being in contact with the peripheral area SA.

According to some exemplary embodiments, the providing of the acid solution AS to the hole area HA to which the film AF is not attached to form the generally concave-convex pattern PT (S330) may be performed by immersing the unfinished window WM-P into the acid solution AS. Since the film AF is not attached to the hole area HA of the unfinished window WM-P, the acid solution AS may be in contact with the unfinished window WM-P in the hole area HA. The generally concave-convex pattern PT may be formed in the hole area HA in which the acid solution AS is in contact with the unfinished window WM-P. The generally concave-convex pattern PT may be formed by etching the unfinished window WM-P in the hole area HA using the acid solution AS. The acid solution AS should not be particularly limited, and a variety of solutions may be applied to form the generally concave-convex pattern PT as long as the solutions may etch the unfinished window WM-P in the hole area HA.

In the forming of the generally concave-convex pattern PT, it is possible to etch a large number of the unfinished windows WM-P in the hole area HA by immersing the plural unfinished windows WM-P into one batch filled with the acid solution at the same time. When the plural unfinished windows WM-P are etched at the same time according to the manufacturing method of the electronic apparatus EA to form the generally concave-convex pattern PT, manufacturing costs may be reduced compared with forming the generally concave-convex pattern PT in each unfinished window WM-P through a dry deposition process in a facility.

The generally concave-convex pattern PT formed by the manufacturing method of the electronic apparatus EA described above may have the shapes shown in FIGS. 5 and 6. However, the exemplary embodiments should not be limited thereto or thereby. In FIGS. 5 and 6, the generally concave portions OT are generally uniformly arranged at substantially regular intervals, however, distances between the concave portions OT may not be uniform in an actual process. In addition, unlike the generally concave portions OT shown in FIGS. 5 and 6, the generally concave portions OT may have different shapes from each other. That is, the generally concave portions OT may have different heights $H_1$ and may have different shapes from each other. In addition, the generally concave portions OT may have different sizes from each other.

Table 1 below shows results obtained by evaluating the reliability of electronic apparatuses. The electronic apparatuses of an embodiment example 1 and an embodiment example 2 include the window in which the generally concave-convex pattern is formed. Examples 1 and 2 were prepared substantially with the same materials and method, and are substantially the same except the electronic apparatus of embodiment example 1 includes a generally concave-convex pattern with a height of about 10 nm, and the electronic apparatus of embodiment example 2 includes a concave-convex pattern with a height of about 5 nm.

Thermal shock test results were obtained by visually observing changes in the electronic apparatus after exposing the electronic apparatus to an environment at a temperature of about 70° C. 200 times every two minutes. Heat-resistant bath test results were obtained by visually observing changes in the electronic apparatus after heating the electronic apparatus in water at a temperature of about 70° C. for one hour.

TABLE 1

|  | Embodiment Example 1 | Embodiment Example 2 |
| --- | --- | --- |
| Improvement of transmittance and reflectance | Transmittance 1.6% ↑ (reflectance 1.6% ↓) | Transmittance 0.6% ↑ (reflectance 0.6% ↓) |
| Thermal shock | No changes | No changes |
| Temperature (50° C.) and humidity (95%) | No changes | No changes |
| Temperature (85° C.) and humidity (85%) | No changes | No changes |
| Heat-resistant bath | No changes | No changes |

Embodiment Example 1 includes the generally concave-convex pattern having the height of about 10 nm and formed in the hole area of the window, and the transmittance is improved by about 1.6%. Embodiment Example 2 includes the generally concave-convex pattern having the height of about 5 nm and formed in the hole area of the window, and the transmittance is improved by about 0.6%. For example, when it is assumed that the transmittance of the window is about 90% before the generally concave-convex pattern is formed, the transmittance of the window is improved to about 91.6% after the generally concave-convex pattern of Embodiment Example 1 is formed.

Referring to the results of Table 1, even though the electronic apparatus is operated in a high temperature and high humidity environment, the electronic apparatus may be operated without any problems. When the electronic apparatus is used in an environment at a temperature of about 50° C. and a humidity of about 95%, the electronic apparatus is operated normally in the same manner as the electronic apparatus in which the generally concave-convex pattern is not yet formed. In addition, when the electronic apparatus is used in an environment at a temperature of about 85° C. and a humidity of about 85%, the electronic apparatus is operated normally in the same manner as the electronic apparatus in which the generally concave-convex pattern is not yet formed.

According to the evaluated results about the thermal shock and the heat-resistant bath of Embodiment Example 1 and Embodiment Example 2, the electronic apparatus is operated normally under the given conditions. That is, the electronic apparatus including the window in which the generally concave-convex pattern according to the exemplary embodiment is formed is operated normally even though the electronic apparatus is repeatedly or continuously exposed to high temperature heat.

As described above, since the height of the generally concave-convex pattern is about one-hundred thousandth of the thickness of the window, there are no issues with the reliability of the electronic apparatus including the window in which the generally concave-convex pattern according to the exemplary embodiment is formed.

The manufacturing method of the electronic apparatus according to the exemplary embodiment includes the forming of the generally concave-convex pattern in the hole area of the window, and thus, the reflection phenomenon in the hole area of the electronic apparatus may be improved. In addition, the forming of the generally concave-convex pattern is performed by immersing the window into the acid solution, and it is possible to etch a large number of the windows during one process. As a result, the manufacturing cost of the electronic apparatus may be reduced.

Electronic apparatus constructed according to the principles and exemplary embodiments include a generally concave-convex pattern disposed in the hole area of the window, which significantly and unexpectedly reduced reflection phenomenon, and improved the resolution of the camera module.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing an electronic apparatus, comprising the steps of:
providing an electronic panel defining a through hole;
providing an electronic module having at least a portion thereof received in the through hole;
providing a protective member having a first surface adjacent to the electronic panel, a hole area overlapping the through hole, a peripheral area surrounding the hole area, and a second surface facing the first surface and spaced apart from the electronic module, the providing of the protective member comprising:
providing an unfinished protective member;
attaching a film to the peripheral area; and
forming a concave-convex pattern by contacting an acid solution with the hole area,
wherein the film comprises an opening overlapping the through hole.

2. The method of claim 1, wherein the film is an acid-resistant film.

3. The method of claim 1, wherein the step of forming of the concave-convex pattern comprises immersing the unfinished protective member into the acid solution.

4. The method of claim 1, wherein the concave-convex pattern comprises a plurality of concave portions recessed toward the second surface, with at least some of the concave portions having a truncated cone shape or a hemispherical shape.

5. The method of claim 1, wherein the concave-convex pattern comprises a plurality of concave portions with random sizes.

6. The method of claim 1, wherein the protective member has a thickness ($D_1$) and the concave-convex pattern has a height ($H_1$) that satisfy the following Equation: $0.71 \times 10^{-5} \leq H_1/D_1 \leq 3 \times 10^{-5}$.

7. The method of claim 1, wherein the concave-convex pattern has a height equal to or greater than about 5 nm and equal to or smaller than about 15 nm in a thickness direction of the protective member.

8. The method of claim 1, wherein the protective member has a thickness equal to or greater than about 0.5 mm and equal to or smaller than about 0.7 mm.

9. The method of claim 1, further comprising, after the forming of the concave-convex pattern, the steps of:
cleaning the unfinished protective member; and
removing the film.

10. A method of manufacturing an electronic apparatus, comprising the steps of:
provide an electronic panel defining a through hole;
providing an electronic module having at least a portion thereof received in the through hole;
providing a protective member having a first surface adjacent to the electronic panel, a hole area overlapping the through hole, a peripheral area surrounding the hole area, and a second surface facing the first surface and spaced apart from the electronic module, the providing of the protective member comprising:
providing an unfinished protective member;
attaching a film to the peripheral area; and
forming a concave-convex pattern by contacting an acid solution with the hole area,
wherein the hole area has an average surface roughness greater than an average surface roughness of the peripheral area.

11. The method of claim 1, wherein the hole area has an average surface roughness greater than an average surface roughness of the second surface.

12. A method of manufacturing an electronic apparatus, comprising the steps of:
providing an electronic panel defining a through hole;
providing an electronic module having at least a portion thereof received in the through hole;
providing a protective member having a first surface adjacent to the electronic panel, a hole area overlapping the through hole, a peripheral area surrounding the hole area, and a second surface facing the first surface and spaced apart from the electronic module, the providing of the protective member comprising:
providing an unfinished protective member;
attaching a film to the peripheral area; and
forming a concave-convex pattern by contacting an acid solution with the hole area,
wherein the electronic module comprises a camera module and the protective member comprises a window.

* * * * *